(12) United States Patent
Lin

(10) Patent No.: US 6,425,767 B1
(45) Date of Patent: Jul. 30, 2002

(54) LINKED PCB AND THE LINKING METHOD THEREOF

(75) Inventor: Chi Cheng Lin, Taoyuan (TW)

(73) Assignee: Acer Peripherals, Inc., Taoyuan (TW)

( * ) Notice: Subject to any disclaimer, the term of this patent is extended or adjusted under 35 U.S.C. 154(b) by 0 days.

(21) Appl. No.: 09/388,535

(22) Filed: Sep. 2, 1999

(30) Foreign Application Priority Data

Oct. 29, 1998 (TW) ............................................ 87118002

(51) Int. Cl.⁷ ................................................. H01R 9/09
(52) U.S. Cl. .......................................... 439/65; 439/511
(58) Field of Search ............................ 439/65, 507, 511

(56) References Cited

U.S. PATENT DOCUMENTS

| | | | |
|---|---|---|---|
| 2,740,097 A | * | 3/1956 | Edelman et al. |
| 3,895,266 A | * | 7/1975 | Geiger ........................ 339/176 |
| 4,143,342 A | * | 3/1979 | Cain et al. ..................... 339/19 |

FOREIGN PATENT DOCUMENTS

GB  2110006  * 6/1983 .................. 439/65

OTHER PUBLICATIONS

J. Lyman, Sized Solder Bumps Make Solid Joints, Electronics, vol. 54, No. 22, Nov. 1981.*

* cited by examiner

Primary Examiner—Tulsidas Patel
Assistant Examiner—Thanh-Tam Le
(74) Attorney, Agent, or Firm—Nath & Associates PLLC; Harold L. Novick

(57) ABSTRACT

A linked PCB and the linking method thereof are provided. In an embodiment, a first PCB is provided with a first row of through holes defined at a first side to connect signals therefrom. A second PCB is provided with a second row of through holes at a second side to connect signals therefrom. The first and second rows of through holes are aligned with each other using a fixing device. Using an element-inserting machine jumpers are provided between the first and second rows of through holes to connect the signals from these two PCBs.

19 Claims, 3 Drawing Sheets

LINKED PCB AND THE LINKING METHOD THEREOF

BACKGROUND OF THE INVENTION

1. Field of the Invention

The present invention relates to a linked PCB and the linking method thereof, which can link two PCBs layered with a different number of layers and reduce the cost for the overall linked PCB without losing good connection characteristics.

2. Description of the Related Art

With the growing number of highly complicated circuits, the demand for multi-layer PCBs has also increased. However, the success of an electronics product usually resides in its competitive price. Therefore, it has become an important issue to reduce the cost for the multi-layer PCBs which occupy a large percentage of the cost for the overall product.

A multi-layer PCB- is a printed circuit board layered with two or more layers, and is used to fabricate a high-density circuit. In most cases, a high-density circuit is printed on a single multi-layer PCB. However, the density of the high-density circuit is usually higher in some regions and lower in other regions. It is uneconomical to fabricate both the higher-density regions and the lower-density regions on a multi-layer PCB.

According, some methods have been disclosed to respectively fabricate the higher-density regions and the lower-density regions on a multi-layer PCB and a single-layer PCB, respectively, and link these two PCBs by connectors, cables or pins, so that the cost for the multi-layer PCB can be lowered.

FIG. 1 (Prior Art) is a diagram showing a first linked PCB in which a multi-layer PCB and a single-layer PCB are linked by connectors and cables. As shown in FIG. 1, the multi-layer PCB 1 is represented by dense inclined lines, and the single-layer PCB 2 is represented by sparse inclined lines. Connectors 3a, 3b are respectively mounted at either sides of the multi-layer PCB 1 and the single-layer PCB 2. A cable 4 is connected between the connectors 3a, 3b.

In this case, lower-density regions of a high-density circuit are fabricated on the single-layer PCB 2, so the area of and the cost for the multi-layer PCB 1 which is used to fabricate higher-density regions of the high-density circuit can be reduced. However, for small circuits, the cost for the connector 3a, 3b and the cable 4 as well as the labor may still occupy a large percentage of the cost for the overall linked PCB. Therefore, the cost reduction of this method is limited.

FIG. 2 (Prior Art) is a diagram showing a second linked PCB in which a multi-layer PCB and a single-layer PCB are linked by connectors. As shown in FIG. 2, the second linked PCB is similar to the first linked PCB as shown in FIG. 1 except that, in the second linked PCB, a male connector 3a' and a female connector 3b' are mounted on either sides of the multi-layer PCB 1 and the single-layer PCB 2 to directly link these two PCBs. Therefore, the cost for the cable 4 can be reduced as compared with the first linked PCB, as shown in FIG. 1.

FIG. 3 (Prior Art) is a diagram showing a third linked PCB in which a multi-layer PCB and a single-layer PCB are linked by a row of pin-sets. As shown in FIG. 3, the third linked PCB is similar to the second linked PCB as shown in FIG. 2 except that, in the third linked PCB, the row of pin-sets 5 are directly stuck into opposed side surfaces of the multi-layer PCB 1 and the single-layer PCB 2 to link these two PCBs together. Therefore, the cost for the male connector 3a' and the female connector 3b' can be further eliminated as compared with the second linked PCB as shown in FIG. 2. In practice, in order to keep intervals between the pin-sets 5 constant, the pin-sets 5 are usually made of rigid material. As a result, the pin-sets 5, when tinning, will seize the multi-layer PCB 1 and the single-layer PCB 2 tightly, resulting in an unevenly linked PCB due to the difference between the expansion coefficient of the multi-layer PCB 1 and that of the single-layer PCB 2.

SUMMARY OF THE INVENTION

Therefore, it is an object of the present invention to provide a linked PCB and the linking method thereof, which can link two PCBs layered with a different number of layers and reduce the cost for the overall linked PCB without losing good connection characteristics.

To realize the above and other objects, the present invention provides a method of linking two PCBs. The linking method includes the steps of:

(a) First, provide a first PCB which defines a row of through holes at one side to connect signals on the first PCB;

(b) Then, provide a second PCB which defines a row of through holes at one side to connect signals on the second PCB;

(c) Arrange the first and second PCBs so that the through holes of the first PCB align with those of the second PCB;

(d) Then, insert jumpers between the through holes of the first PCB and those of the second PCB; and (e) Tin the first and second PCBs to connect these two PCBs.

In this linking method, the first and second PCBs can be layered with different numbers of layers. When the first and second PCBs are arranged so that the through holes of the first PCB align with those of the second PCB, the through holes of the first PCB are spaced from those of the second PCB by a predetermined pitch. The step (c) can be achieved using a fixing device, while the step (d) can be achieved using an element-inserting machine.

Further, the present invention provides a linked PCB derived from the method mentioned above. The linked PCB includes a first PCB, a second PCB and several jumpers. In the linked PCB, a row of through holes are defined at one side of the first PCB to connect signals therefrom to signals from the second PCB. Similarly, a row of through holes are also defined at one side of the second PCB to connect signals therefrom to the signals on the first PCB. The through holes of the first PCB correspond to those of the second PCB. The jumpers are then placed between the first and second through holes to connect the first and second PCBs, and tinned to connect these two PCBs.

BRIEF DESCRIPTION OF THE DRAWINGS

Further objects, features and advantages of the present invention will become apparent from the following detailed description of a preferred embodiment of the invention with reference to the accompanying drawings.

DETAILED DESCRIPTION OF THE PREFERRED EMBODIMENT

Figure 4A:
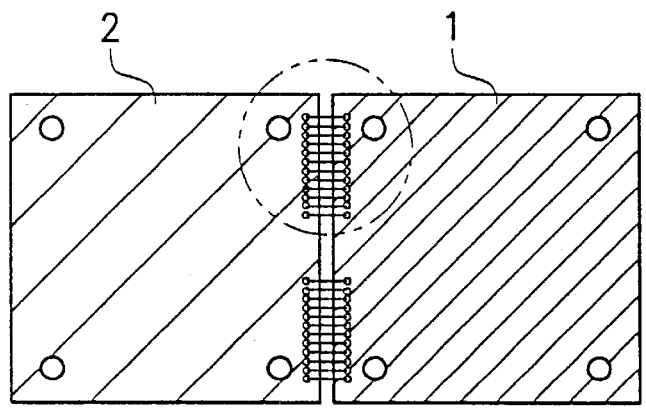
FIG. 4A is a diagram showing a linked PCB of the present invention in which a multi-layer PCB and a single-layer PCB are linked by jumpers.
Figure 4B:
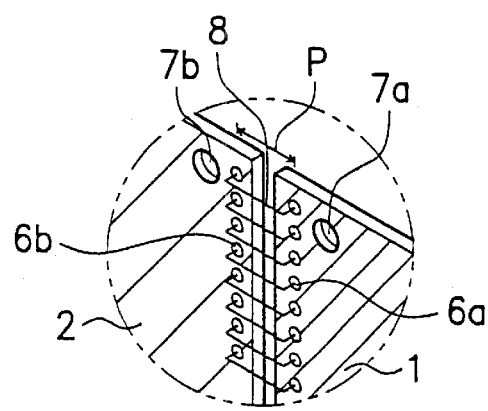
FIG. 4B is a diagram showing a close-up of a portion of FIG. 4A.

FIGS. 4A and 4B are diagrams showing a linked PCB of the present invention in which a multi-layer PCB 1 and a single-layer PCB 2 are linked by jumpers.

In this embodiment, a row of through holes 6a are defined at one side of the multi-layer PCB 1 to connect signals thereon to be connected to the single-layer PCB 2. Similarly, a row of through holes 6b are defined at one side of the single-layer PCB 2 so as to connect signals thereon to be connected to the multi-layer PCB 1.

Then, the multi-layer PCB 1 and the single-layer PCB 2 are fixed by a fixing device (not shown) so as to align the through holes 6a of the multi-layer PCB 1 with those of the single-layer PCB 2, and spaced from those of the single-layer PCB 2 by a constant pitch p.

Figure 5:
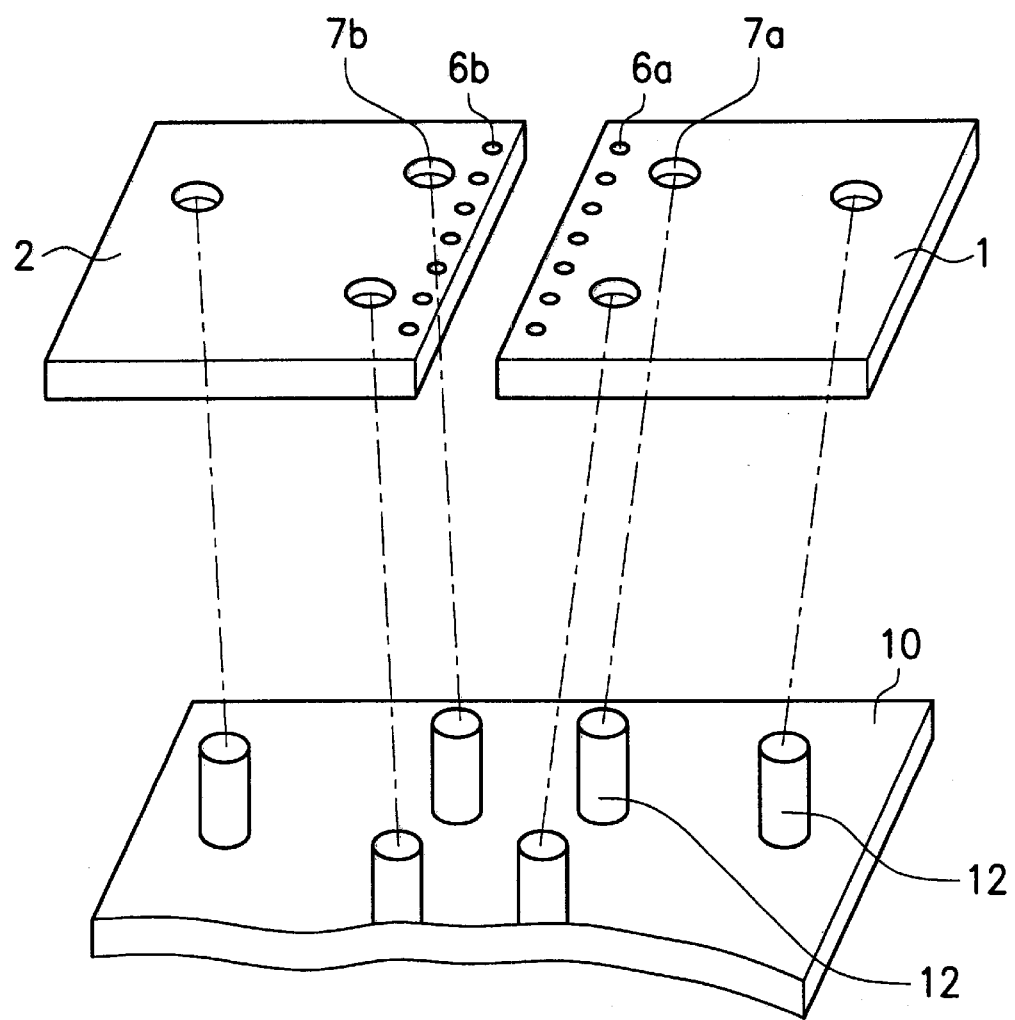
FIG. 5 is a diagram showing a fixing device used in the linked PCB or the linking method of the present invention.

FIG. 5 is a diagram showing a fixing device used in the linked PCB or the linking method of the present, invention. In this embodiment, the fixing device can be a plate 10 with several fixing pillars 12 formed thereon. The fixing pillars 12 correspond to fixing holes 7a, 7b defined on the multi-layer PCB 1 and the single-layer PCB 2 as shown in FIG. 5. As a consequence, when the multi-layer PCB 1 and the single-layer PCB 2 are installed on the plate 10,the fixing pillars 12 will pierce through the fixing holes 7a, 7b and the row of through holes 6a of the multi-layer PCB 1 will align with the row of through holes 6b of the single-layer PCB 2. After that, the jumper placing and tinning steps can proceed smoothly. Further, the fixing device can be achieved by a frame (not shown). In this case, the multi-layer PCB 1 and the single-layer PCB 2 can be directly placed into the frame so that the through holes 6a of the multi-layer PCB 1 will align with the through holes 6b of the single-layer PCB 2.

Next, non-interconnected jumpers 8 are inserted between the row of through holes 6a of the multi-layer PCB 1 and the row of through holes 6b of the single-layer PCB2. The jumpers 8 between the multi-layer. PCB 1 and the single-layer PCB 2 are tinned and fixed together with other elements installed on these two PCBs, so the connection between these two PCBs and the installation of these elements can be achieved at the same time without adding additional steps. In this embodiment, the jumpers 8 can be inserted by an element-inserting machine (not shown) or human hands, and the jumpers 8 and other jumpers installed on each PCB (not shown) can be made of the same material, which is usually tough and not flexible. Therefore, the jumpers 8 can not be easily broken due to repetitive bending and can not easily recover after having been bent. Generally, the diameter of the jumpers 8 is under 5 mm. By using tough and not flexible jumpers, there will be only a negligible stress remained in the jumpers 8 even these two PCBs are bent and recovered due to the difference between the expansion coefficients of the multi-layer PCB 1 and the single-layer PCB 2. Further, if even there exists any unevenness as a result of a manufacturing error of a stand or base, these two PCBs can still be linked on this uneven stand or base.

In the jumper inserting step, the jumpers 8 are like any electric elements (for example, such as resisters and capacitors) installed on the multi-layer PCB 1 and the single-layer PCB 2, and can be achieved by an element-inserting machine or human hands. Therefore, neither special equipment nor a further step is needed.

From the linking method as mentioned above, higher-density regions of a high-density circuit are fabricated on the multi-layer PCB 1, and lower-density regions of the high-density circuit are fabricated on the single-layer PCB 2. However, "multi-layer" and "single-layer" are only used to represent two PCBs with different numbers of layers, and are not used to restrict the numbers of layers. In some case, the multi-layer PCB can be fabricated as a 4-layer PCB, and the single-layer PCB can be fabricated as a 1-layer PCB. In other cases, the multi-layer PCB can be fabricated as a 6-layer PCB, and the single-layer PCB can be fabricated as a 2-layer PCB. Additionally, it is also obvious that the linking method can be applied to link two PCBs with the same number of layers, and the linking method can be extended to link more than two PCBs.

Further, the linked PCB obtained from the linking method as mentioned above are composed of the multi-layer. PCB 1, the single-layer PCB 2 and some jumpers 8.

The multi-layer PCB 1 is provided with a row of through holes 6a defined at one side to connect signals to the single-layer PCB 2. The single-layer PCB 2 is provided with a row of through holes 6b defined at one side to connect signals to the multi-layer PCB 1. The through holes 6a correspond to the through holes 6b and are spaced from the through holes 6b by a constant pitch. The jumpers 8 are then placed between the through holes 6a of the multi-layer PCB 1 and the through holes 6b of the single-layer PCB 2, so as to connect these two PCBS.

Figure 1:
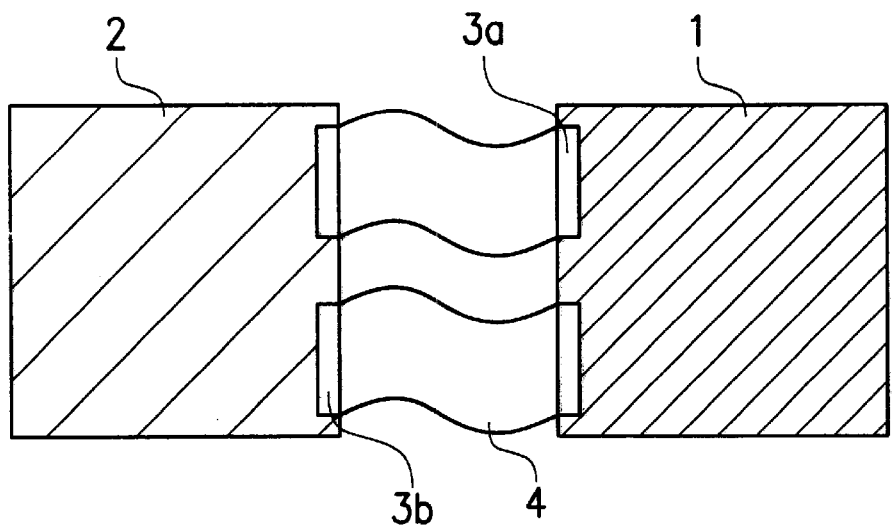
FIG. 1 (Prior Art) is a diagram showing a first linked PCB in which a multi-layer PCB and a single-layer PCB are linked by connectors and cables.
Figure 2:
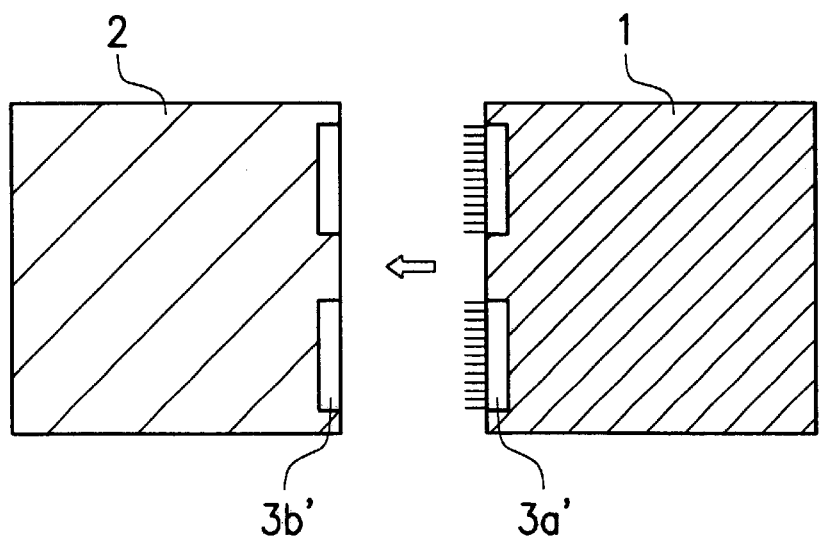
FIG. 2 (Prior Art) is a diagram showing a first linked PCB in which a multi-layer PCB and a single-layer PCB are linked by connectors.
Figure 3:
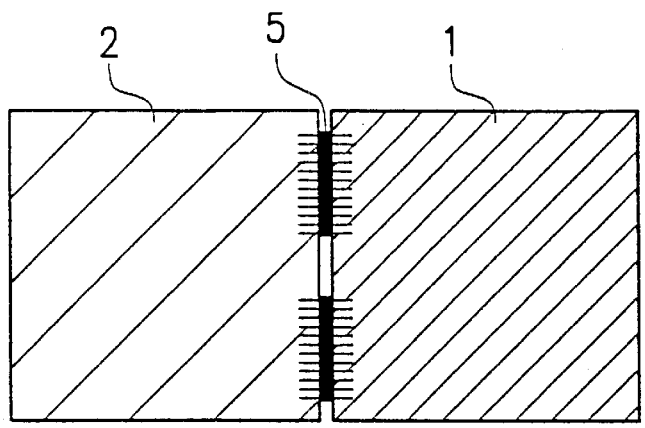
FIG. 3 (Prior Art) is a diagram showing a first linked PCB in which a multi-layer PCB and a single-layer. PCB are linked by a row of pin-sets.

Summing up the above, the linking method of the present invention and the linked PCB obtained therefrom can reduce the cost for the overall multi-layer PCB compared with conventional linked PCBs, without losing good connection characteristics. For a 40-pin high-density circuit, the results of cost utilizing the first, second and third methods as shown in FIGS. 1, 2 and 3 are respectively around 40, 40 and 20 NT dollars, while the present invention reduces the cost to less than 2 NT dollars. Further, the use of tough and not flexible jumpers also avoids unevenly linked PCBs due to the difference between the expansion coefficients of the multi-layer PCB and the single-layer PCB.

It should be understood that the present invention is not limited to the preferred embodiment as disclosed above. Variations and modifications can be made by those who are skillful in the art without departing from the spirit and scope of the present invention as defined in the appended claims. Thus, this invention is not to be limited to the disclosed embodiment except as required by the appended claims.

What is claimed is:

1. A method of linking two PCBs, comprising:
   providing a first PCB having a first row of through holes at a first side to connect signals therefrom;
   providing a second PCB having a second row of through holes at a second side to connect signals therefrom;
   arranging the first and second PCBs in substantially the same plane so that the first and second rows of through holes are aligned with each other; and
   placing and connecting a plurality of discrete non-interconnected jumpers between the first and second rows of through holes.

2. The method of linking two PCBs as claimed in claim 1, wherein the first and second PCBs are layered with a different number of layers.

3. The method of linking two PCBs as claimed in claim 1, wherein the first and second rows of through holes are aligned with and spaced apart from each other by a predetermined pitch.

4. The method of linking two PCBs as claimed in claim 1, wherein a fixing device is used to temporarily fix the first and second PCBs so that the first and second rows of through holes are aligned with and spaced apart from each other by a predetermined pitch during the placing and connecting of the plurality of discrete jumpers.

5. The method of linking two PCBs as claimed in claim 4, wherein a plurality of fixing holes are defined on the first and second PCBs, and the fixing device is a plate with a plurality of pillars, wherein the plurality of fixing holes receive the plurality of pillars so as to align and space apart the first and second rows of through holes by a predetermined pitch.

6. The method of linking two PCBs as claimed in claim 4, wherein the fixing device is a frame for receiving the first and second PCBs when the first and second PCBs are placed in the frame and the first and second rows of through holes are aligned with and spaced from each other by the predetermined pitch.

7. The method to link two PCBs as claimed in claim 4, wherein the jumper placing step is accomplished using an element-inserting machine.

8. The method of linking two PCBs as claimed in claim 1, wherein the step of connecting the jumpers between the first and second rows of through holes comprises tinning the first and second PCBs to connect the signals from the first and second PCBs.

9. A linked PCB, comprising:
a first PCB having a first row of through holes at a first side to connect signals therefrom;
a second PCB having a second row of through holes at a second side to connect signals therefrom, wherein the first and second row of through holes are aligned with each other and the first and second PCBs are in substantially the same plane; and
a plurality of discrete substantially non-flexible non-interconnected jumpers connected between the first and second rows of through holes to connect the signals from the first and second PCBs such that the first PCB is fixed to the second PCB in a substantially rigid manner.

10. The linked PCB as claimed in claim 9, wherein the first and second PCBs are layered with different numbers of layers.

11. The linked PCB as claimed in claim 9, wherein the jumpers connected between the first and second rows of through holes are of the same material as those on the first and second PCB.

12. A method of linking a first PCB and a second PCB, the first PCB having a first row of through holes at a first side to connect electrical signals therefrom and at least one first fixing hole, and the second PCB having a second row of through holes at a second side to connect electrical signals therefrom and at least one second fixing hole;
providing a fixing device having at least one first post corresponding to the first fixing hole, and at least one second post corresponding to the second fixing hole;
disposing the first PCB on the fixing device such that the at least one first fixing post is received by the at least one first fixing hole;
disposing the second PCB on the fixing device such that the at least one second fixing post is received by the at least one second fixing hole; wherein when the first and second PCBs are disposed on the fixing device, the first and second rows of through holes are aligned with each other and the first and second PCBs are in substantially the same plane;
placing and connecting a plurality of substantially non-flexible discrete non-interconnected jumpers between the first and second rows of through holes;
fixing the jumpers to the first and second PCBs; and
removing the linked first and second PCBs from the fixing device.

13. The method of linking a first PCB and a second PCB as claimed in claim 12, wherein the first and second PCBs are layered with a different number of layers.

14. The method of linking a first PCB and a second PCB as claimed in claim 12, wherein when the first and second PCBs are disposed on the fixing device, the first and second rows of through holes are aligned with and spaced apart from each other by a predetermined pitch.

15. The method of linking two PCBs as claimed in claim 12, wherein the fixing step includes the step of tinning the jumpers.

16. A method of linking two PCBs, comprising:
providing a first PCB having a first row of through holes at a first side to connect electrical signals therefrom;
providing a second PCB having a second row of through holes at a second side to connect electrical signals therefrom;
arranging the first and second PCBs so that the first and second rows of through holes are aligned with each other; and
lacing a plurality of discrete substantially non-flexible jumpers between the first and second rows of through holes such that the first and second PCBs are maintained in a substantially fixed position relative to each other by the jumpers.

17. The method of linking two PCBs as claimed in claim 16, wherein the step of arranging the first and second PCBs comprises the step of fixing the first and second PCBs to a fixing device such that the first and second rows of through holes are aligned and spaced apart from each other by a predetermined pitch.

18. The method of linking two PCBs as claimed in claim 17, further comprising the step of removing the PCBs from the fixing device after lacing.

19. The method of linking two PCBs as claimed in claim 17, wherein a plurality of fixing holes are defined on the first and second PCBs, and the fixing device is a plate with a plurality of pillars, wherein the step of fixing the first and second PCBs to the fixing device comprises receiving the plurality of pillars in the plurality of fixing holes.

* * * * *